(12) United States Patent
Na et al.

(10) Patent No.: US 9,029,875 B2
(45) Date of Patent: May 12, 2015

(54) LIGHT EMITTING DEVICE AND METHOD FOR MANUFACTURING THE SAME

(75) Inventors: Jong Ho Na, Seoul (KR); Se Hwan Sim, Seoul (KR); Chong Cook Kim, Seoul (KR); Jae In Yoon, Seoul (KR); Jong Pil Jeong, Seoul (KR); Jung Hyun Hwang, Seoul (KR); Dong Han Yoo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 33 days.

(21) Appl. No.: 13/429,623

(22) Filed: Mar. 26, 2012

(65) Prior Publication Data
US 2012/0241770 A1    Sep. 27, 2012

(30) Foreign Application Priority Data

| Mar. 25, 2011 | (KR) | 10-2011-0026980 |
| Mar. 30, 2011 | (KR) | 10-2011-0028964 |
| Jul. 18, 2011 | (KR) | 10-2011-0071146 |
| Feb. 2, 2012 | (KR) | 10-2012-0010626 |

(51) Int. Cl.
H01L 27/15    (2006.01)
H01L 29/167   (2006.01)
(Continued)

(52) U.S. Cl.
CPC .............. *H01L 33/06* (2013.01); *H01L 33/007* (2013.01); *H01L 33/32* (2013.01); *H01L 2924/0002* (2013.01); *H01L 2224/48091* (2013.01); *H01L 2224/48247* (2013.01)

(58) Field of Classification Search
USPC ........................... 257/9, 13, 14, 79–103, 918, 257/E51.018–E51.022, E33.001–E33.077, 257/E33.054, E25.028, E25.032, 257/E29.069–E29.071, E29.245, 257/E49.001–E49.004, E33.008, E33.005, 257/22, E33.067, E33.068, E33.074, 15, 257/184, 21, E21.002, E29.072, E29.168, 257/E33.013, E33.023, E33.025, E33.028, 257/E33.033, E33.062, 17, 18, 76, 257/E21.001, E21.089, E21.097, E21.326, 257/E27.136, E29.002, E29.068, E29.091, 257/E29.097, E31.032, E31.033, E31.038, 257/E33.002, E33.007, E33.027, E33.034, 257/E33.066, 113, 185, 190, 191, 28, 338, 257/440, 87, 88, 91; 438/104, 22–47, 69, 438/493, 503, 507, 956, 11, 12, 20, 478, 438/48; 359/246, 248, 245, 247, 260
See application file for complete search history.

(56) References Cited

U.S. PATENT DOCUMENTS 5,416,338 A    5/1995   Suzuki et al. ................... 257/21
(Continued)

FOREIGN PATENT DOCUMENTS

WO    WO 2007/004768 A1    1/2007

OTHER PUBLICATIONS

European Search Report issued in Application No. 12161091.9 dated Oct. 30, 2014.

*Primary Examiner* — Colleen A Matthews
*Assistant Examiner* — Junaiden Mirsalahuddin
(74) *Attorney, Agent, or Firm* — KED & Associates, LLP

(57) ABSTRACT

Disclosed are a light emitting device, a method for manufacturing the same, a light emitting device package, and a lighting system. The light emitting device includes a first conductive semiconductor layer, an active layer comprising a well layer and a barrier layer on the first conductive layer, and a second conductive semiconductor layer on the active layer. The well layer includes a first well layer closest to the first conductive semiconductor layer and having a first energy bandgap, a third well layer closest to the second conductive semiconductor layer and having a third energy bandgap, and a second well layer interposed between the first and third well layers and having a second energy bandgap. The third energy bandgap of the third well layer is greater than the second energy bandgap of the second well layer.

11 Claims, 11 Drawing Sheets

(51) Int. Cl.
*H01L 31/12* (2006.01)
*H01L 33/00* (2010.01)
*H01L 33/06* (2010.01)
*H01L 33/32* (2010.01)

(56) References Cited

U.S. PATENT DOCUMENTS

| | | | |
|---|---|---|---|
| 2007/0090339 A1 | 4/2007 | Lee et al. | 257/14 |
| 2007/0152225 A1* | 7/2007 | Ooi et al. | 257/76 |
| 2007/0241353 A1 | 10/2007 | Taki | 257/94 |
| 2008/0023689 A1* | 1/2008 | Kim et al. | 257/13 |
| 2008/0093593 A1* | 4/2008 | Ryu | 257/13 |
| 2009/0162999 A1 | 6/2009 | Lin et al. | |
| 2009/0166668 A1* | 7/2009 | Shakuda | 257/103 |

\* cited by examiner

LIGHT EMITTING DEVICE AND METHOD FOR MANUFACTURING THE SAME

CROSS-REFERENCE TO RELATED APPLICATION

This application claims Korean Patent Application No. 10-2011-0026980 (filed Mar. 25, 2011), Korean Patent Application No. 10-2011-0028964 (filed Mar. 30, 20110, Korean Patent Application No. 10-2011-0071146 (filed Jul. 18, 2011), and Korean Patent Application No. 10-2012-0010626 (filed Feb. 2, 2012) which are hereby incorporated by reference in their entireties.

BACKGROUND

The embodiment relates to a light emitting device, a method for manufacturing the light emitting device, a light emitting device package, and a lighting system.

An LED (Light Emitting Device) is a compound semiconductor device to convert electrical energy into light energy and can emit lights having various colors by adjusting the compositional ratio of a compound semiconductor.

For example, a nitride semiconductor light emitting device has been spotlighted in development fields of an optical device and a high-power electronic device due to high thermal stability and wide bandgap energy. In particular, blue, green, and ultraviolet light emitting devices including a nitride semiconductor have been commercialized and extensively used.

In addition, when comparing conventional light sources such as a fluorescent lamp, and an incandescent lamp, the nitride semiconductor light emitting device has advantages such as low power consumption, a semi-permanent life span, a rapid response speed, stability, and an eco-friendly property. The application of the nitride semiconductor light emitting device is expanded to a light emitting diode backlight serving as a substitute for a CCFL (Cold Cathode Fluorescence Lamp) constituting a backlight of an LCD (Liquid Crystal Display), a white light emitting diode lightening device serving as a substitute for the fluorescent lamp or the incandescent lamp, a vehicle headlight, and a signal light.

In order to expand the application range of the nitride semiconductor light emitting device, the technology for the high efficiency of the light emitting device must be basically developed.

In the light emitting device according to the related art, when a forward voltage is applied, electrons injected from an N-type GaN based electron injection layer are combined with holes injected from a P-type GaN based hole injection layer, so that energy corresponding to the energy gap between a conduction band and a valance band is radiated. The energy is mainly emitted in the form of heat or light. The light emitting device emits the energy in the form of light.

According to the related art, since holes have effective masses greater than those of the electrons, the mobility of holes are remarkably lower than the mobility of the electrons.

In addition, according to the related art, activated hole concentration is lower than electron concentration.

Therefore, according to the related art, light is emitted mainly from a well layer adjacent to a P-type GaN layer, so that the light emission efficiency is reduced. Accordingly, light characteristic may be degraded.

In addition, according to the related art, low carrier distribution is represented in another well layer except for the well layer of the active layer adjacent to the P-type GaN layer, so that the contribution to the luminous intensity by the recombination of holes and electrons may be lowered.

BRIEF SUMMARY

The embodiment provides a light emitting device capable of improving luminous intensity, a method for manufacturing the light emitting device, a light emitting device package, and a lighting system.

In addition, the embodiment provides a light emitting device capable of improving luminous intensity while minimizing the wavelength change of an emitted light, a method for manufacturing the light emitting device, a light emitting device package, and a lighting system.

According to the embodiment, there is provided a light emitting device including a first conductive semiconductor layer, an active layer comprising a well layer and a barrier layer on the first conductive layer, and a second conductive semiconductor layer on the active layer. The well layer includes a first well layer closest to the first conductive semiconductor layer and having a first energy bandgap, a third well layer closest to the second conductive semiconductor layer and having a third energy bandgap, and a second well layer interposed between the first and third well layers and having a second energy bandgap. The third energy bandgap of the third well layer is greater than the second energy bandgap of the second well layer.

According to the embodiment, there is provided a method for manufacturing a light emitting device. The method includes forming a first conductive semiconductor layer, forming an active layer on the first conductive semiconductor layer, and forming a second conductive semiconductor layer on the active layer. The forming of the active layer includes forming a first well layer closest to the first conductive semiconductor layer and having a first energy bandgap, forming a third well layer closest to the second conductive semiconductor layer and having a third energy bandgap, and forming a second well layer between the first and third well layers and having a second energy bandgap. The forming of the second well layer is performed at a third growth temperature, the forming of the third well layer is performed at a fourth growth temperature, and the fourth growth temperature is higher than the third growth temperature.

In addition, according to the embodiment, the light emitting device package according to the embodiment includes a package body part, at least one electrode layer on the package body part, a light emitting device electrically connected to the electrode layer, and a molding member on the light emitting device.

In addition, according to the embodiment, the lighting system may include a predetermined substrate and a light emitting module including the light emitting package provided on the substrate.

DETAILED DESCRIPTION OF THE EMBODIMENTS

Figure 1:
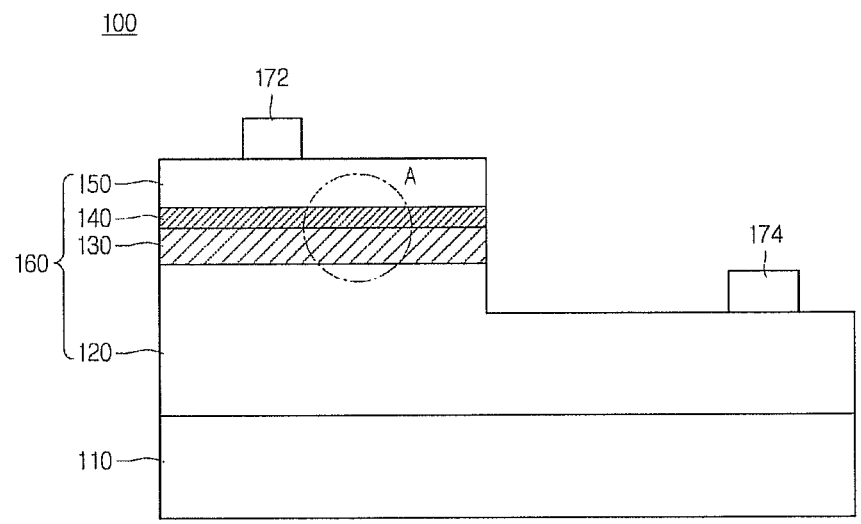
FIG. 1 is a sectional view showing a light emitting device according to the embodiment.

Hereinafter, a light emitting device according to the embodiment, a method for manufacturing the same, a light emitting device package, and a lighting system will be described with reference to accompanying drawings.

In the description of embodiments, it will be understood that when a layer (or film) is referred to as being 'on/over' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiment)

According to the technology for manufacturing a nitride semiconductor light emitting device based on a multiple-well layer structure of the related art, a droop phenomenon occurs in which internal quantum efficiency is degraded as the injection current is increased.

Electrons and holes placed at quantum energy levels corresponding to the ground state in the well layer are combined with each other to emit light if the quantum-mechanical combining condition is satisfied.

However, one well layer can retain a predetermined amount of holes or electrons quantum-mechanically at a quantized energy level corresponding to the ground state (quantum number, n=1) representing the lowest energy state. In addition, a higher quantized level (higher quantum number of quantized energy level) has more energy states to retain holes and electrons than the ground state.

Therefore, if electrons or holes are sufficiently injected, carriers (electrons and holes) placed at a higher quantized energy level in one well layer are moved into the ground state of another adjacent well layer to participate in light emission.

However, in the nitride semiconductor light emitting device having an active layer (a light emission layer) having a multiple-well layer structure according to the related art, all well layers of the active layer do not accept injected carriers with uniform distribution, but only a small number of well layers adjacent to a P-type GaN layer serving as a hole injection layer mainly contribute to light emission. Therefore, if a sufficient amount of injected current is supplied, extra electrons or extra holes that are not effectively confined in the active layer may occur.

The extra electrons or extra holes do not participate in the light emission, but are self-destructed in the active layer through a nonradiative recombination process, or leaked out of the active layer.

According to the nitride semiconductor light emitting device of the related art, since a very great internal field originally exists in the active layer due to the polar property of a material, and electrons injected into the active layer have a hot carrier property, carrier overflow may seriously occur.

Accordingly, if an injected current is increased, the non-emission loss of electrons and holes is increased, so that the light emission efficiency of the active layer, for example, the internal quantum efficiency may be seriously reduced.

In a nitride semiconductor light emitting device based on an active layer having a multiple-well layer structure according to the related art, the reduction of the light emission efficiency caused by the application of a high current described above becomes one of important technical problems when realizing a light emitting device for high-power lighting.

Meanwhile, according to the related art, since the mobility of holes are remarkably lower than the mobility of electrons, light emission occurs in mainly the well layer of the active layer adjacent to the P-type GaN layer. Accordingly, the light emission efficiency is degraded, so that the optical characteristics may be lowered.

Therefore, the embodiment provides a light emitting device capable of improving luminous intensity, a method for manufacturing the light emitting device, a light emitting device package, and a lighting system.

In addition, the embodiment provides a light emitting device capable of improving luminous intensity while minimizing the variation in the wavelength of an emitted light, a method for manufacturing the light emitting device, a light emitting device package, and a lighting system.

Figure 2:
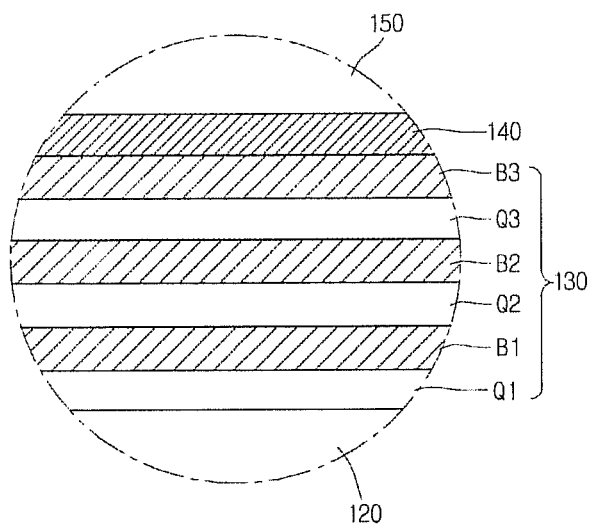
FIG. 2 is a partial sectional view showing the light emitting device according to the embodiment.

FIG. 1 is a sectional view showing a light emitting device 100 according to the embodiment, and FIG. 2 is an enlarged sectional view of a part A of the light emitting device 100 according to the embodiment.

Referring to FIG. 1, the light emitting device 100 according to the embodiment may include a support member 110 and a light emitting structure 160 provided on the support member 110. The light emitting structure 160 may include a first conductive semiconductor layer 120, an active layer 130, an intermediate layer 140, and a second conductive semiconductor layer 150.

The support member 110 may include a conductive substrate or an insulating substrate. The material of the support member 110 can be semiconductor material, metal material, composite material, or the combination thereof. Also, the support member 110 can be a single layer or multy layers. For example, the support member 110 may include at least one of sapphire ($Al_2O_3$), SiC, Si, GaAs, GaN, ZnO, GaP, InP, Ge, and $Ga_2O_3$. The refractive index of the support member 110 may be less than the refractive index of the first conductive semiconductor layer 120 for the purpose of light extraction efficiency.

Meanwhile, a PSS (Patterned Substrate) structure may be provided on a top surface of the support member 110 in order to increase the light extraction efficiency, but the embodiment is not limited thereto.

According to the embodiment, the support member 110 may be provided thereon with a buffer layer (not shown) to attenuate lattice mismatching between the support member 110 and the first conductive semiconductor layer 120 and used to easily grow a semiconductor layer. The material of the buffer layer (not shown) can be semiconductor material, metal material, composite material, or the combination thereof. The buffer layer (not shown) may be formed at a low-temperature atmosphere, and may include a material to reduce a lattice constant difference between the semiconductor layer and the support member 110. For example, the buffer layer may include a material selected from the group consisting of GaN, InN, AlN, AlInN, InGaN, AlGaN, and AlGaN, but the embodiment is not limited thereto.

The buffer layer (not shown) may be grown in a single crystal structure on the support member 110. The buffer layer grown in the single crystal structure can improve the crystalline of the first conductive semiconductor layer 120 grown on the buffer layer.

The buffer layer may be provided thereon with the light emitting structure 160 including the first conductive semiconductor layer 120, the active layer 130, and the second conductive semiconductor layer 150.

The first conductive semiconductor layer 120 may be placed on the buffer layer. The first conductive semiconductor layer 120 may be a semiconductor layer such as group III-V element or group II-VI element etc and may be doped with a first conductive type dopant. Also, the first conductive semiconductor layer 120 can be a single layer or multy layers.

The first conductive semiconductor layer 120 may be an n-type semiconductor layer, and can supply carriers, for example, electrons to the active layer 130. The first conductive semiconductor layer 120 may include a semiconductor material having a compositional formula of $In_xAl_yGa_{1-x-y}N$ ($0 \leq x \leq 1$, $0 \leq y \leq 1$, and $0 \leq x+y \leq 1$), for example, a material selected from the group consisting of GaN, AlN, AlGaN, InGaN, InN, InAlGaN, and AlInN. The first conductive semiconductor layer 120 may be doped with n-type dopants such as Si, Ge, and Sn, but the embodiment is not limited thereto.

In addition, an undoped semiconductor layer (not shown) may be additionally formed under the first conductive semiconductor layer 120, but the embodiment is not limited thereto. The undoped semiconductor layer is formed to improve the crystalline of the first conductive semiconductor layer 120. The undoped semiconductor layer may be identical to the first conductive semiconductor layer 120 except that the undoped semiconductor layer has electrical conductivity lower than that of the first conductive semiconductor layer 120 since the undoped semiconductor layer is not doped with n-type dopants.

The active layer 130 may be formed on the first conductive semiconductor layer 120. The active layer 130 may have a single quantum structure, a multiple quantum structure, a quantum-wire structure, or a quantum dot structure by using a compound semiconductor material including group III-V element.

If the active layer 130 is formed in a well-layer structure, the active layer 130 may have a single quantum well-layer structure or a multiple well-layer structure having a well layer having a compositional formula of $In_xAl_yGa_{1-x-y}N$ ($0 \leq x \leq 1$, $0 \leq y \leq 1$, and $0 \leq x+y \leq 1$) and a barrier layer having a compositional formula of $In_aAl_bGa_{1-a-b}N$ ($0 \leq a \leq 1$, $0 \leq b \leq 1$, and $0 \leq a+b \leq 1$). The well layer may include a material having energy bandgap less than that of the barrier layer.

In addition, when the active layer 130 has a multiple well-layer structure, the well layers may have different In contents and different energy bandgaps, and the details thereof will be described later with reference to FIGS. 2 to 3.

A conductive clad layer (not shown) may be formed on and/or under the active layer 130. The conductive clad layer can be formed of a semiconductor layer having a wider energy bad gap than that of the barrier layer of the active layer 130. For example, the conductive clad layer can include GaN, AlGaN, InAlGaN or super lattice structure. Also, the conductive clad layer can be a single layer or multy layers and may be doped with n-type dopant or p-type dopant.

The second conductive semiconductor layer 150 may be a semiconductor layer such as group III-V element or group II-VI element etc and may be doped with a second conductive type dopant. Also, the second conductive semiconductor layer 150 can be a single layer or multy layers. The second conductive semiconductor layer 150 may include a p-type semiconductor layer so that holes may be injected into the active layer 130. For example, the second conductive semiconductor layer 150 may include a semiconductor material having a compositional formula of $In_xAl_yGa_{1-x-y}N$ ($0 \leq x \leq 1$, $0 \leq y \leq 1$, and $0 \leq x+y \leq 1$), for example, a material selected from the group consisting of GaN, AlN, AlGaN, InGaN, InN, InAlGaN, and AlInN. The second conductive semiconductor layer 150 may be doped with p-type dopants such as Mg, Zn, Ca, Sr, and Ba, but the embodiment is not limited thereto.

Meanwhile, the intermediate layer 140 may be interposed between the active layer 130 and the second conductive semiconductor layer 150. The intermediate layer 140 may serve as an electron blocking layer to prevent carriers, for example, electrons, which are injected from the first conductive semiconductor layer 120 to the active layer 130 when a high current is applied, from flowing into the second conductive semiconductor layer 150 without recombination in the active layer 130.

The intermediate layer 140 has an energy bandgap greater than that of the active layer 130 to prevent the electrons injected from the first conductive semiconductor layer 130 from being injected into the second conductive semiconductor layer 150 without the recombination in the active layer 130. Therefore, the intermediate layer 140 can increase the probability to recombine electrons with holes in the active layer 140 and can prevent leakage current.

Meanwhile, the intermediate layer 140 may have energy bandgap greater than energy bandgap of the barrier layer included in the active layer 130. For example, the intermediate layer 140 may include a semiconductor layer, such as AlGaN, containing Al, but the embodiment is not limited thereto.

The first conductive semiconductor layer 120, the active layer 130, the intermediate layer 140, and the second conductive semiconductor layer 150 may be formed through an MOCVD (Metal Organic Chemical Vapor Deposition) scheme, a CVD (Chemical Vapor Deposition) scheme, a PECVD (Plasma-Enhanced Chemical Vapor Deposition) scheme, an MBE (Molecular Beam Epitaxy) scheme, an HVPE (Hydride Vapor Phase Epitaxy) scheme, or a sputtering scheme, but the embodiment is not limited thereto.

In addition, the doping concentration of conductive dopants included in the first and second conductive semiconductor layers 120 and 150 may be uniform or irregular. In other words, a plurality of semiconductor layers may have the distribution of various doping concentrations, but the embodiment is not limited thereto.

Meanwhile, as described above, the first conductive semiconductor layer 120 may be realized by using a n-type semiconductor layer, and the second conductive semiconductor layer 150 may be realized by using an p-type semiconductor layer. A third semiconductor layer (not shown) including an n-type semiconductor layer or a p-type semiconductor layer may be formed on the second conductive semiconductor layer 150. Accordingly, the light emitting device 100 may have at least one of np, pn, npn and pnp junction structures.

Meanwhile, portions of the active layer 130 and the second conductive semiconductor layer 150 may be removed to expose a portion of the first conductive semiconductor layer 120, and a first electrode 174 may be formed on the exposed first conductive semiconductor layer 120. In other words, the first conductive semiconductor layer 120 may have a top surface facing the active layer 130 and a bottom surface facing the support member 110. The top surface of the first conductive semiconductor layer 120 may include at least one exposed region, and the first electrode 174 may be provided on the exposed region of the top surface.

Meanwhile, a portion of the first conductive semiconductor layer 120 may be exposed through a predetermined etching scheme, but the embodiment is not limited thereto. The etching scheme may include a wet etching scheme or a dry etching scheme.

In addition, a second electrode 172 may be formed on the second conductive semiconductor layer 150.

Meanwhile, the first and second electrodes 174 and 172 may include a conductive material, for example, a metal selected from the group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or may include the alloy thereof. The first and second electrodes 174 and 172 may have a single layer structure of a multiple-layer structure, but the embodiment is not limited thereto.

FIG. 2 is an exploded sectional view of a part A of FIG. 1.

Referring to FIG. 2, the active layer 130 of the light emitting device 100 may have a multiple-well layer structure. Accordingly, the active layer 130 may include a well layer Q and a barrier layer B (see FIG. 3). The well layer Q may include first to third well layers Q1 to Q3, and the barrier layer B may include first to third barrier layers B1 to B3, but the embodiment is not limited thereto.

In addition, the first to third well layers Q1, Q2, and Q3 and the first to third barrier layers B1, B2, and B3 may have an alternately laminated structure as shown in FIG. 2.

Meanwhile, FIG. 2 shows that the first to third well layers Q1, Q2, and Q3, the first to third barrier layers B1, B2, and B3, and the first to third barrier layers B1, B2, and B3 and the first to third well layers Q1, Q2, and A3 are alternately laminated on each other, but the embodiment is not limited thereto. The number and the arrangement of the well layers Q and the barrier layers B may be randomly formed.

As described above, the well layers Q and the barrier layers B may include materials having different composition ratios, different energy bandgaps, and different thicknesses, but the embodiment is not limited to the structure shown in FIG. 2.

(First Embodiment)

Figure 3:
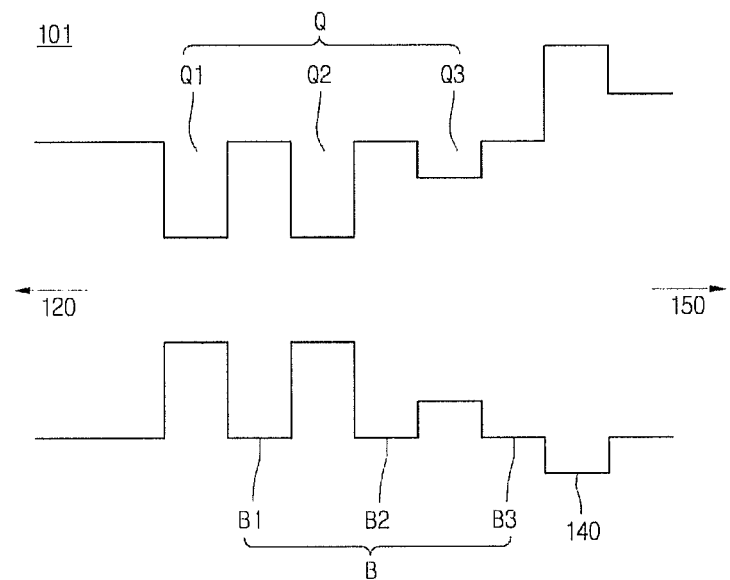
FIG. 3 is a view showing an energy band diagram of the light emitting device according to a first embodiment.

FIG. 3 is a view showing an energy band diagram 101 of the light emitting device according to the first embodiment.

Referring to FIG. 3, the energy bandgap of the third well layer Q3 may be greater than energy bandgaps of the first and second well layers Q1 and Q2.

As the energy bandgap of the third well layer Q3 adjacent to the second conductive semiconductor layer 150 supplying carriers, for example, holes to the active layer 130 is greater than the energy bandgap of the first and second well layers Q1 and Q2, holes may be easily moved. Therefore, holes crossing over the second conductive semiconductor layer 150 or the intermediate layer 140 may be more easily injected into the third well layer Q3. Accordingly, the injection efficiency of holes is more increased, and the injection efficiency of holes into the first and second well layers Q1 and Q2 may be increased.

In addition, since energy bandgap of the third well layer Q3 is greater than the energy bandgaps of the first and second well layers Q1 and Q2, and less than the energy bandgap of the barrier layer B, interlaminar stress, which is caused by the energy bandgap difference between the bander layer B and the second conductive semiconductor layer 150 representing greater energy bandgaps and the well layer Q representing a less energy bandgap, is reduced, so that the reliability for the light emitting device 100 can be more improved.

According to the embodiment, the third well layer Q3 may be referred to as a well layer formed at the farthest position away from the first conductive semiconductor layer 120, and may be referred to as a well layer at the closest position to the second conductive semiconductor layer 150. The first and second well layers Q1 and Q2 may have the same energy bandgap, or may have energy bandgaps less than that of the third well layer Q3.

For example, if the active layer 130 emits blue light, the third energy bandgap of the third well layer Q3 may be in the range of about 2.8 eV to about 3.08 eV, but the embodiment is not limited thereto.

In addition, although the energy gap difference from the third energy bandgap of the third well layer Q3 may be about 0.1 eV or less, the embodiment is not limited thereto. For example, the energy gap difference between the third energy bandgap of the third well layer Q3 and the second energy bandgap of the second well layer Q2, or the first energy bandgap of the first well layer Q1 may be about 0.1 eV or less.

In addition, according to the embodiment, the third well layer Q3 may have the energy bandgap about 2.5% greater than the energy bandgap of the second well layer Q2. For example, the wavelength of light emitted from the third well layer Q3 may be shorter than the wavelength of the light emitted from the second well layer Q2 by the range within about the 20 nm.

According to the embodiment, the wavelength of the light emitted from the third well layer Q3 may be shorter than the wavelength of the light emitted from the second well layer Q2 by the range from about 2 nm to about 20 nm.

If the wavelength of the light emitted from the third well layer Q3 is shorter than the wavelength of the light emitted from the second well layer Q2 by about 2 nm or less, the effect to increase the injection of carriers is not greatly represented. If the wavelength of the light emitted from the third well layer Q3 is shorter than the wavelength of the light emitted from the second well layer Q2 by over at least 20 nm, light having another color is emitted, so that color rendering may be degraded.

Meanwhile, as described above, the well layer Q may have a compositional formula of $In_xAl_yGa_{1-x-y}N$ ($0 \leq x \leq 1$, $0 \leq y \leq 1$, and $0 \leq x+y \leq 1$). As the In content of the well layer Q is increased, the energy bandgap may be reduced. In contrast, as the In content of the well layer Q is reduced, the energy bandgap may be increased.

The In content of the third well layer Q3 may correspond to the range from 90% to 99% of the In content of the first well layer Q1 or the second well layer Q2. The ratio does not exert an influence on the stability and the reliability of the light emitting device 100 according to the energy bandgap and the lattice constant, but may increase the crystalline and the hole injection efficiency of the light emitting device 100. Meanwhile, the ratio may be one of a molar ratio, a volume ratio, and a mass ratio, but the embodiment is not limited thereto.

For example, if the composition formula of the well layer Q is $In_xAl_yGa_{1-x-y}N$ ($0 \leq x \leq 1$, $0 \leq y \leq 1$, and $0 \leq x+y \leq 1$), the composition (x3) of the In of the third well layer Q3 may be less than the composition (x2) of the In of the second well layer Q2 by 0.02 or less, but the embodiment is not limited thereto.

Meanwhile, piezoelectric polarization may occur in a semiconductor layer due to the lattice constant difference between semiconductor layers and the alignment of the semiconductor layers. Since the semiconductor material constituting a light emitting device has a great piezoelectric coefficient, the semiconductor material may cause very great polarization even if small strain occurs.

The electric field caused by two polarizations changes the energy band structure of a well layer structure to distort the distribution of electrons and holes. This phenomenon is referred to a quantum confined stark effect (QCSE). This phenomenon may cause low internal quantum efficiency in the light emitting device to generate light through the recombination of electrons and holes, and may exert a bad influence, such as a red shift of the light emission spectrum, on the electrical and optical characteristics of the light emitting device.

As described above, the well layer Q may have a compositional formula of ($0 \leq x \leq 1$, $0 \leq y \leq 1$, and $0 \leq x+y \leq 1$), and the barrier layer B may have a compositional formula of $In_aAl_bGa_{1-a-b}N$ ($0 \leq a \leq 1$, $0 \leq b \leq 1$, and $0 \leq a+b \leq 1$).

The lattice constant of InN is greater than that of GaN, and the lattice constant of the well layer Q is increased as In content contained in the well layer Q is increased, so that the lattice constant difference between the barrier layer B and the well layer Q is increased. Accordingly, strain between layers may be more greatly increased.

The polarization effect is more increased due to the strain, so that the internal electric field is enhanced. Accordingly, the energy band is curved according to the electric field, so that a sharp triangle potential well is created, and electrons or holes may be concentrated in the triangle potential well. Accordingly, the recombination between the electrons and the holes may be degraded.

According to the embodiment, the In content of the third well layer Q3 is decreased, so that the lattice constant is reduced. Accordingly, the lattice constant difference between the barrier layer B and the third well layer Q3 may be reduced. Therefore, the generation of the triangle potential well may be reduced. As a result, the recombination of the electrons and holes may be increased, and the light emission efficiency of the light emitting device 100 can be improved.

Therefore, the energy bandgap of the third well layer Q3 adjacent to the second conductive semiconductor layer 150 is greatly formed, and a high potential barrier is formed, so that the third well layer Q3 has resistance against carriers (e.g., holes) supplied from the second conductive semiconductor layer 150. The path of holes may be diffused.

In addition, the well depth of the third well layer Q3 is reduced, so that an amount of holes injected into another well layer may be increased. The recombination between electrons and holes may occur in the wider range throughout the whole area of the active layer 130 through the diffusion of the path of the holes, so that the combination rate between electrons and holes may be improved. Accordingly, the light emission efficiency of the light emitting device 100 can be improved.

Meanwhile, crystal defects caused by the lattice constant difference between the support member 110 and the light emitting structures formed on the support members 110 may be increased according to the growth direction. Accordingly, the second conductive semiconductor layer 150 formed at the farthest position away from the support member 110 may have the greatest crystal defect.

Since the hole mobility is lower than the electron mobility, the degradation in the hole injection efficiency caused by the crystalline degradation of the second conductive semiconductor layer 150 may degrade the light emission efficiency of the light emitting device 100.

However, according to the embodiment, the energy bandgap between the active layer 130 and the third well layer Q3 is greatly formed, thereby blocking the propagation of the crystal defect. The crystal defect of the second conductive semiconductor layer 150 can be overcome, and the light emission efficiency of the light emitting device 100 can be improved.

In addition, according to the embodiment, the active layer 130 may emit light having a substantially same color. For example, even if the active layer 130 includes the first well layer Q1, the second well layer Q2, and the third well layer Q3, and the energy bandgaps of the well layers may be different from each other, so that the well layers do not emit light having the same wavelength, the active layer 120 may emit light having a substantially same color.

According to the embodiment, the well layer Q may be in an undoped. If the well layer is doped, light may not be emitted.

The embodiment can provide a light emitting device capable of improving luminous intensity by increasing the total amount of carriers injected into the active layer and a method for manufacturing the same.

In addition, the embodiment can provide a light emitting device capable of improving luminous intensity by increasing the distribution of carriers injected into the active layer and a method for manufacturing the same.

Figure 4:
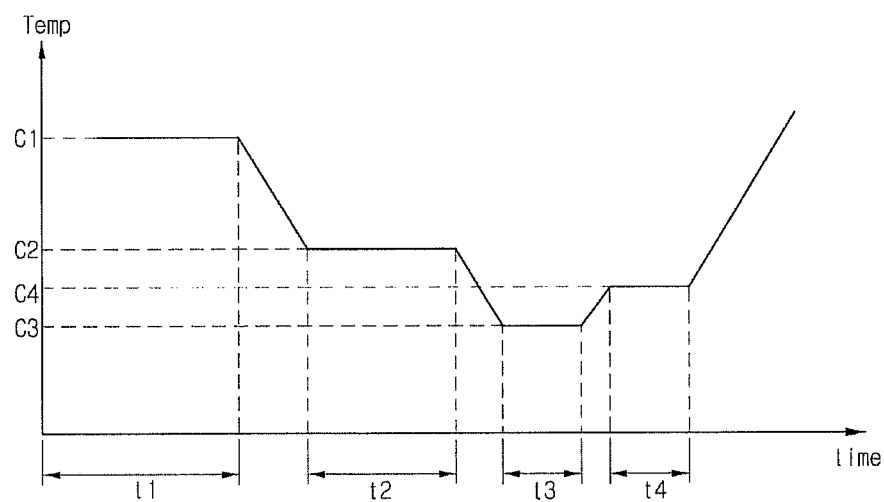
FIG. 4 is a graph showing the growth temperature of the light emitting device according to the first embodiment as a function of a time.

FIG. 4 is a graph showing a process of growing a light emitting device according to the first embodiment according to a growth time and a growth temperature Temp.

After growing the first conductive semiconductor layer 120 at a first growth temperature C1 for a growth time t1, the growth temperature is reduced, so that a lower sub layer (not shown) can be grown between the first conductive semiconductor layer 120 and the active layer 130 at a second growth temperature C2 for a growth time t2. Thereafter, the growth temperature is more reduced, so that the active layer 130 is grown at a third growth temperature C3 for the growth time t3. Before the third well layer Q3 is grown during the growth of the active layer 130, the growth temperature is increased to the fourth growth temperature C4, so that the third well layer Q3 may be grown at a fourth growth temperature C4 for the time t4.

According to the embodiment, the fourth growth temperature C4 may have a value corresponding to about 100.4% to about 103% of the value of the third growth temperature C3, but the embodiment is not limited thereto. The ratio may be a condition in which the crystalline and the hole injection efficiency of the light emitting device can be improved by adjusting the In composition without an influence on the stability and the reliability for the light emitting device.

Since the fourth growth temperature C4 of the third well layer Q3 is higher than the third growth temperature C3 of the first well layer Q1 and the second well layer Q2, the In content of the third well layer Q3 may be reduced. Accordingly, as described above, the energy bandgap of the third well layer Q3 may be increased, and the injection efficiency of holes injected into the third well layer Q3, the first well layer Q1, and the second well layer Q2 may be increased, so that the light emission efficiency of the light emitting device can be improved.

In addition, as the fourth growth temperature C4 of the third well layer Q3 is increased, the difference between the growth temperature of the first and second conductive semiconductor layers 120 and 150 grown at a temperature higher than that of the active layer 130 and the growth temperature of the active layer 130 may be decreased. Therefore, the characteristic of the thin film is improved, so that the reliability for the light emitting device 100 can be improved.

According to the embodiment, a time t3 to form the first well layer Q1 or the second well layer Q2 is substantially identical to a time t4 to form the third well layer Q3, and a thickness of the first well layer Q1 or the second well layer Q2 may be substantially identical to a thickness of the third well layer Q3, but the embodiment is not limited thereto.

Figure 5A:
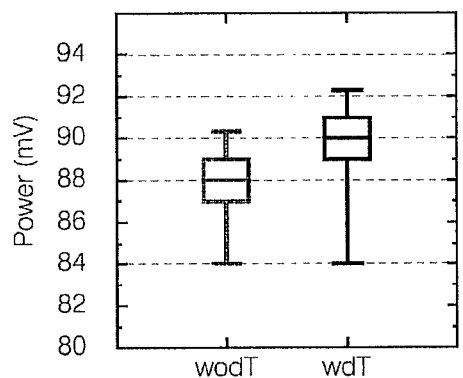
FIG. 5A is a graph showing the variation in the output of the light emitting device according to the first embodiment.
Figure 5B:
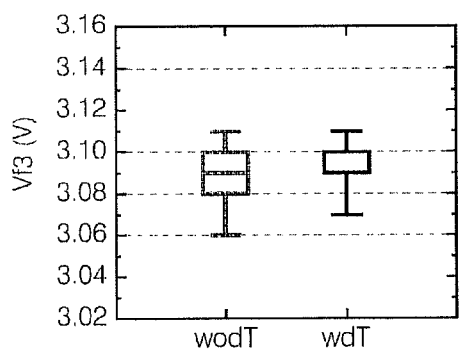
FIG. 5B is a graph showing the variation in the operating voltage of the light emitting device according to the first embodiment.
Figure 5C:
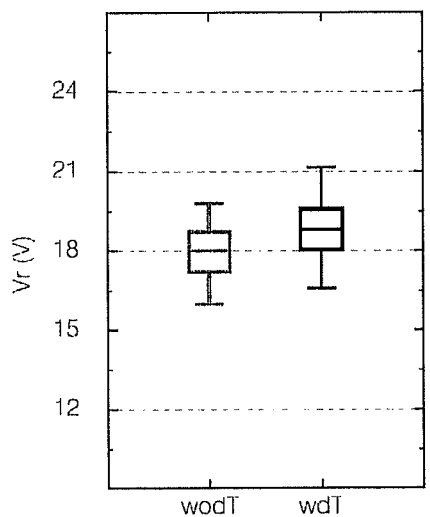
FIG. 5C is a graph showing the variation in the revere voltage of the light emitting device according to the first embodiment.
Figure 5D:
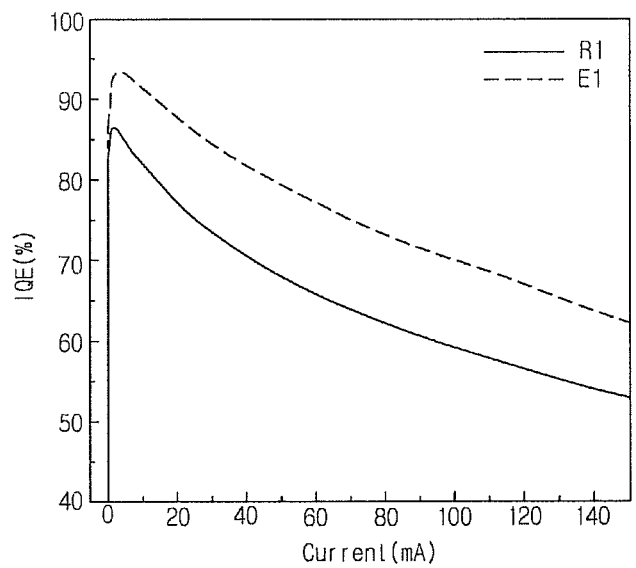
FIG. 5D is a graph showing the variation of the internal light emission efficiency of the light emitting device according to the first embodiment.

FIG. 5A is a graph showing the variation in the output of the light emitting device according to the first embodiment, and FIG. 5B is a graph showing the variation in the operating voltage of the light emitting device according to the first embodiment. FIG. 5C is a graph showing a reverse voltage of the light emitting device according to the first embodiment, and FIG. 5D is a graph showing the variation in the internal light emission efficiency of the light emitting device according to the first embodiment.

Referring to FIG. 5A, a light emitting device wdT, in which the energy bandgap of a well layer adjacent to a p-type semiconductor layer according to the first embodiment is greatly represented, represents a more improved output than that of a comparison example wodT.

Referring to FIG. 5B, the light emitting device wdT, in which the energy bandgap of the well layer adjacent to the p-type semiconductor layer according to the first embodiment is greatly represented, represents an operating voltage substantially identical to that of the comparison example wodT. Therefore, although the output of the light emitting device is improved, the operating voltage is not increased. Accordingly, the operating voltage can be decreased with the same output, and more improved light emission efficiency can be obtained under the same operating voltage.

Referring to FIG. 5C, the light emitting device wdT, in which the energy bandgap of the well layer adjacent to the p-type semiconductor layer according to the first embodiment is greatly represented, represents a more improved reverse voltage than that of the comparison example wodT.

Referring to FIG. 5D, a light emitting device E1, in which the energy bandgap of a well layer adjacent to a p-type semiconductor layer according to the first embodiment is greatly represented, represents a more improved quantum efficiency IQE than that of a comparison example R1. Therefore, according to the embodiment, a droop phenomenon, in which the internal quantum efficiency is degraded as the injection current is increased, can be remarkably improved.

The embodiment can provide a light emitting device capable of improving luminous intensity by increasing the total amount of carriers injected into the active layer, and a method for manufacturing the light emitting device.

In addition, the embodiment can provide a light emitting device capable of improving luminous intensity by increasing the distribution of carriers injected into the active layer, and a method for manufacturing the light emitting device.

(Second Embodiment)

Figure 6:
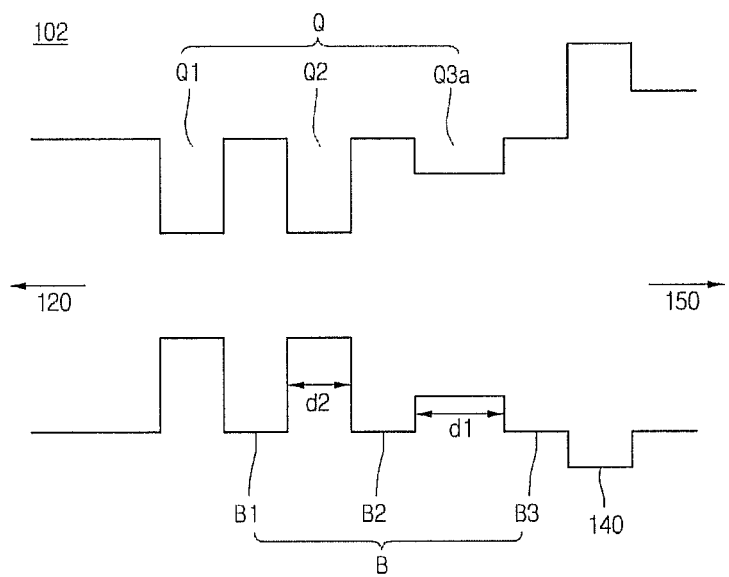
FIG. 6 is a view showing an energy bandgap diagram of a light emitting device according to a second embodiment.
Figure 7:
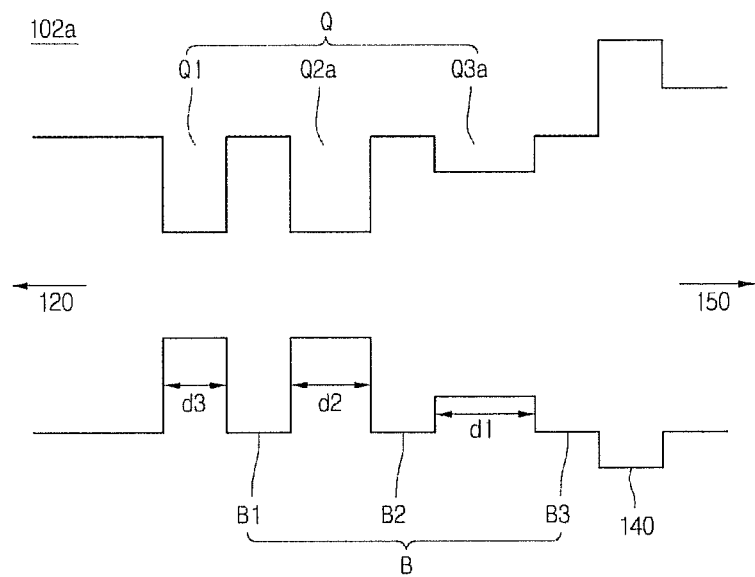
FIG. 7 is a view showing another example of an energy bandgap diagram of the light emitting device according to the second embodiment.

FIG. 6 is a view showing an energy band diagram 102 of a light emitting device according to a second embodiment, and FIG. 7 is a view showing an energy band diagram 102a of the light emitting device according to the second embodiment.

The second embodiment can employ the technical characteristics of the first embodiment.

Therefore, the active layer 130 according to the second embodiment may have a multiple-well layer structure. Accordingly, the active layer 130 may include first to third well layers Q1, Q2, and Q3, and first to third barrier layers B1, B2, and B3.

According to the second embodiment, a thickness d1 of the third well layer Q3a may be thicker than a thickness d2 of the second well layer Q2. In addition, according to the second embodiment, the thickness d1 of the third well layer Q3a may be thicker than a thickness of the first well layer Q1.

For example, the third well layer Q3a adjacent to the second conductive semiconductor layer 150 may have the thickness d1, and the second well layer Q2 may have the thickness d2. The thickness d1 may be greater than the thickness d2. For example, the thickness d1 may correspond to about 110% to about 130% of the thickness d2, but the embodiment is not limited thereto. In addition, the thickness d1 of the third well layer Q3a may correspond to about 110% to about 130% of the thickness of the first well layer Q1, but the embodiment is not limited thereto.

For example, if the active layer 130 emits blue light, the third well layer Q3a may have a thickness of about 3.9 nm, but the embodiment is not limited thereto.

According to the second embodiment, the energy bandgap of the third well layer Q3a may be greater than the energy bandgaps of the first well layer Q1 and the second well layer Q2.

The energy bandgap of the third well layer Q3a adjacent to the second conductive semiconductor layer 150 supplying holes to the active layer 120 is greater than the energy bandgaps of the first and second well layers Q1 and Q2, so that the mobility of the holes can be easily performed. Therefore, holes crossing over the second conductive semiconductor layer 150 or the intermediate layer 140 may be more easily injected to the third well layer Q3a. Therefore, the injection efficiency of holes is more improved, and the efficiency to inject holes to the first well layers Q1 and the second well layer Q2 may be increased.

Meanwhile, the In content of the third well layer Q3a may be 90% to 99% of the In contents of the first well layer Q1 and the second well layer Q2.

According to the embodiment, if the third well layer Q3a has energy bandgap greater than the energy bandgap of the second well layer Q2, a difference is made in energy bandgap between the well layers, so that the light energy of the well layers may be varied. This means that the wavelengths of lights emitted from the well layers are different from each other. Therefore, since the third well layer Q3a has energy bandgap greater than that of the second well layer Q2, the third well layer Q3a generates light having greater energy, so that the third well layer Q3a generates light having a shorter wavelength.

Figure 9:
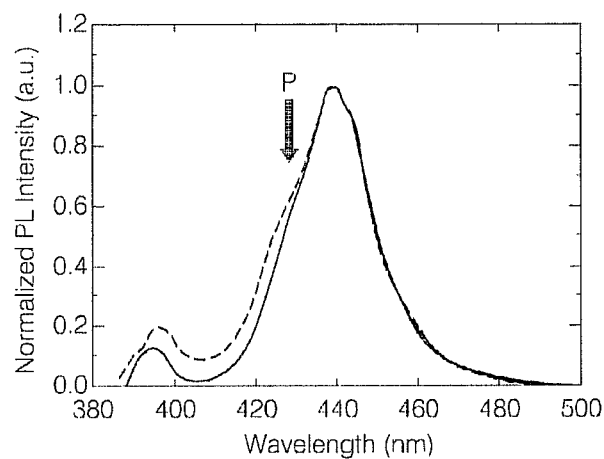
FIG. 9 is a graph showing the variation in the output of the light emitting device according to the second embodiment.

Therefore, as shown in FIG. 9, the broadening of the light emission spectrum of the light emitting device may be increased toward a short wavelength (dotted line), and a shoulder P may be formed in the photoluminescence spectrum of the light emitting device 100.

As described above, the third well layer Q3a adjacent to the second conductive semiconductor layer 150 may have the thickness d1, and the second well layer Q2 may have the thickness d2. The thickness d1 may be greater than the thickness d2.

According to the embodiment, the energy level formula of light emitted from the well layer Q is expressed following Equation 1.

$$E_n = \frac{n^2 \hbar^2 \pi^2}{2\,mL^2} \qquad \text{Equation 1}$$

In this case, the L corresponds to the thicknesses d1 or d2 of the well layer. Accordingly, as the thickness of the well layer Q is increased, the energy level of light emitted from the well layer Q can be lowered. If the third well layer Q3a has energy bandgap greater than that of the second well layer Q2, the well layers may have different energy levels. Therefore, the broadening of the light emission spectrum of the light emitting device may be increased, and the shoulder P may be formed in the photoluminescence spectrum of the light emitting device 100.

According to the second embodiment, the thickness of the third well layer Q3a is thicker than the thickness of the second well layer Q2, so that the energy levels of the lights emitted from the well layers Q1, Q2, and Q3a can be uniformly formed even if the energy bandgaps of the well layers Q are different from each other. Therefore, the broadening of the light emission spectrum of the light emitting device 100 may be reduced, and the generation of the shoulder P of the photoluminescence spectrum may be reduced. Therefore, the well structure having superior quality is formed, the light emission efficiency of the light emitting device is improved, and the shift toward the short wavelength does not occur.

According to the embodiment, if the thickness d1 does not exceed 110% of the thickness d2, the energy of the light emitted from the third well layer Q3a is less reduced, so that the shift toward the short wavelength still exists. If the thickness d1 exceeds 130% of the thickness d2, the energy of the light emitted from the third well layer Q3a is too short, so that the shift toward the long wavelength may occur.

Meanwhile, as shown in FIG. 7, the energy bandgaps of the first to third well layers Q1, Q2a, and Q3a may have sequentially great values, so that the first to third well layers Q1, Q2a, and Q3a may have thicknesses that are sequentially thick.

The In contents are sequentially less contained in the first well layer to the third well layer Q1, Q2a, and Q3a, so that the first well layer to the third well layer Q1, Q2a, and Q3a have sequentially increased thicknesses.

For example, the thickness d1 of the third well layer Q3 may be thicker than the thickness d2 of the second well layer Q2, and the thickness d2 of the second well layer Q2 may be thicker than the thickness d3 of the first well layer Q1, but the embodiment is not limited thereto.

As the well layers Q are gradually closer to the second conductive semiconductor layer 150 injecting holes, the well layers Q have greater energy bandgaps. Accordingly, the hole injection efficiency of the first to third well layers Q1, Q2a, and Q3a can be improved. Accordingly, the light emission efficiency of the light emitting device 100 can be improved.

In addition, as the energy bandgap is sequentially increased from the first well layer Q1 to the third well layer Q3a, the lattice constant difference between the well layer Q and the barrier layer B and between the first and second conductive semiconductor layers 120 and 150 is reduced, so that the generation of the triangle potential well can be reduced. Accordingly, the recombination rate of the electrons and the holes may be increased, and the light emission efficiency of the light emitting device 100 can be improved.

In addition, as the energy bandgap of the well layer Q is increased, the thickness of the well layer Q is increased, so that the energy levels between the well layers Q are uniformly formed. Accordingly, even if the well layers Q have different energy bandgaps, the broadening of the light emission spectrum of the light emitting device 100 may be reduced, and the generation of the shoulder P of the photoluminescence spectrum may be reduced. Therefore, the well structure having superior quality is formed, so that the light emission efficiency of the light emitting device 100 can be improved.

Figure 8:
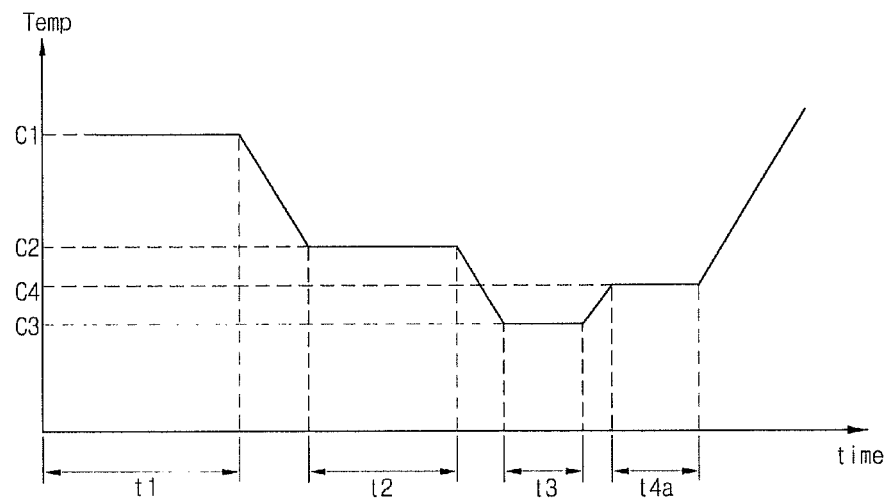
FIG. 8 is a graph showing the growth temperature of the light emitting device according to the second embodiment as a function of a time.

FIG. 8 is a graph showing the growth temperature of the light emitting device according to the second embodiment as a function of a time.

The growth condition of the second embodiment may employ the technical characteristics according to the first embodiment.

For example, a growth temperature is increased to the fourth growth temperature C4 before the third well layer Q3a is grown during the growth step of the active layer 130, and the third well layer Q3a can be grown at the fourth growth temperature C4.

For example, the fourth growth temperature C4 may have a value corresponding to about 100.4% to about 103% of the third growth temperature C3.

According to the second embodiment, the growth time t4a of the third well layer Q3a is more increased than that of the first well layer Q1 or the second well layer Q2, so that the thickness of the third well layer Q3a is more increased than the thicknesses of the first well layer Q1 and the second well layer Q2. Accordingly, even if the well layers Q have different energy bandgaps, the energy levels between the well layers Q may be uniformly formed, the broadening of the light emission spectrum of the light emitting device 100 may be reduced, and the generation of the shoulder P of the photoluminescence spectrum may be reduced. Therefore, the well structure having superior quality is formed, so that the light emission efficiency of the light emitting device 100 can be improved.

FIG. 9 is a graph showing the variation in the output of the light emitting device according to the second embodiment.

Referring to FIG. 9, the photoluminescence spectrum of the light emitting device including the third well layer Q3a having a thick thickness in adjacent to the p-type semiconductor layer according to the second embodiment is expressed in a solid line, and the photoluminescence spectrum of the light emitting device including well layers having a uniform thickness is expressed in a dotted line.

As shown in FIG. 9, although the shoulder P is formed in the photoluminescence spectrum of the light emitting device including well layers having different energy bandgaps but uniform thickness, the generation of the shoulder P of the photoluminescence spectrum of the light emitting device including a third well layer Q3a having a thick thickness in adjacent to the p-type semiconductor layer according to the second embodiment is reduced, and the broadening of the spectrum is reduced.

The embodiment can provide a light emitting device capable of improving luminous intensity by increasing the total amount of carriers injected into the active layer and a method for manufacturing the light emitting device.

In addition, the embodiment can provide a light emitting device capable of improving luminous intensity by increasing the distribution of carriers injected into the active layer, and a method for manufacturing the light emitting device.

In addition, the embodiment can provide a light emitting device capable of improving luminous intensity while minimizing the variation in the wavelength of the emitted light and a method for manufacturing the light emitting device.

In addition, the embodiment can provide a light emitting device and a method for manufacturing the same, in which the growth temperature of a well layer adjacent to the p-type semiconductor layer or an n-type semiconductor layer is increased, so that the recombination rate of carriers (holes or electrons) can be improved, and the thin film characteristic can be improved.

(Third Embodiment)

Figure 10:
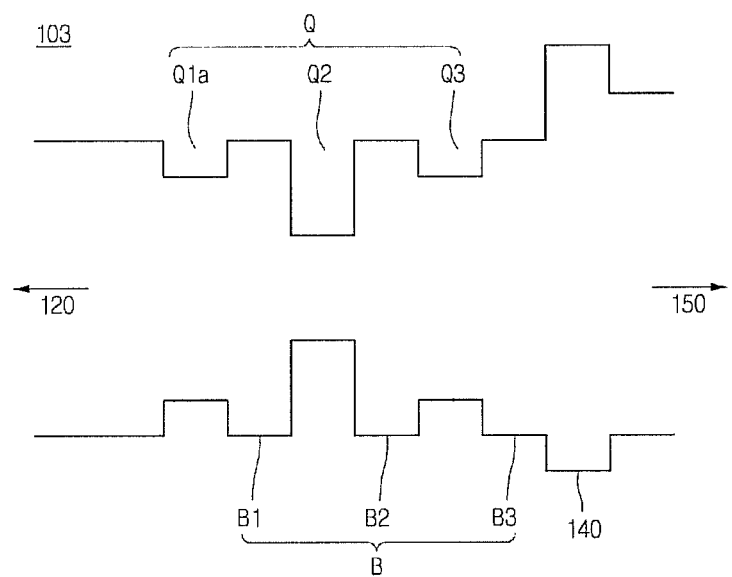
FIG. 10 is a view showing an energy band diagram of a light emitting device according to a third embodiment.

FIG. 10 is a view showing an energy band diagram 103 of a light emitting device according to the third embodiment.

The third embodiment can employ the technical characteristics of the first embodiment or the second embodiment. For example, the energy bandgap of the third well layer Q3 according to the third embodiment may be greater than the energy bandgap of the second well layer Q2.

Meanwhile, according to the third embodiment, the first energy bandgap of the first well layer Q1a according to the third embodiment may be greater than the second energy bandgap of the second well layer Q2.

In addition, the first energy bandgap of the first well layer Q1a may be identical to the third energy bandgap of the third well layer Q3, but the embodiment is not limited thereto.

According to the embodiment, the energy bandgap of the first well layer Q1a formed at the closest position to the first conductive semiconductor layer 120 is increased, so that electrons can be more easily injected into the next well layer. Accordingly, the injection efficiency of the electron carriers can be increased.

In addition, according to the embodiment, the energy bandgap of the first well layer Q1a formed firstly on the first conductive semiconductor layer 120 is increased, so that the crystal quality is improved. Accordingly, the crystal quality of the next well layers formed on the first well layer Q1a can be more improved. This can improve the reliability as well as the optical characteristic.

Figure 11A:
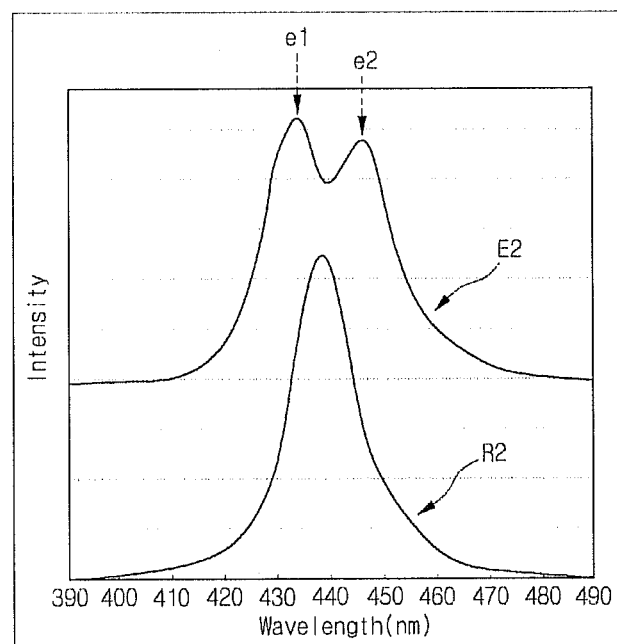
FIG. 11A is a graph showing an optical characteristic of the light emitting device according to the third embodiment.
Figure 11B:
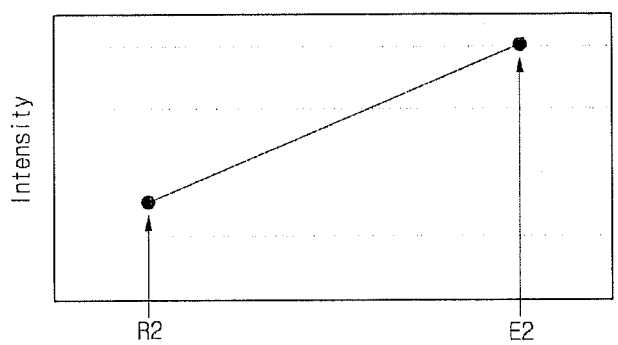
FIG. 11B is a graph showing another example of an optical characteristic of the light emitting device according to the third embodiment.

FIG. 11A is graph showing an example of the optical characteristic of the light emitting device according to the third embodiment, and FIG. 11b is a graph showing another example of the optical characteristic of the light emitting device according to the third embodiment.

The light emission characteristics of the light emitting device according to the embodiment are considered in terms of light e1 emitted from the third well layer Q3 adjacent to the second conducive semiconductor layer 150 and light e2 emitted from other well layers.

As shown in FIG. 11A, according to the embodiment, as the energy bandgap of the third well layer Q3 is increased, the hole carrier density is increased. In addition, as the energy bandgap of the first well layer Q1a is increased, the electron carrier concentration is increased, so that the whole light emission efficiency E2 of the embodiment can be remarkably improved as compared with the light emission efficiency R2 according to the related art as shown in FIG. 11B.

According to the embodiment, in the state that the hole carrier density is increased as the energy bandgap of the third well layer Q3 is increased, the electron carrier density is increased as the energy bandgap of the first well layer Q1a is increased. Accordingly, the actual injection improvement of the electron carriers more increases the improvement of the light emission characteristic.

According to the embodiment, the difference in the energy bandgap between the first well layer Q1a and another well layer may be about 2.5% or more. If the difference in the energy bandgap is less than about 2.5%, the effect to increase the injection of carriers is not great.

According to the embodiment, the energy bandgap of the well layer Q can be controlled by controlling the In content of the well layer or by controlling the thickness of the well layer.

(Fourth Embodiment)

Figure 12:
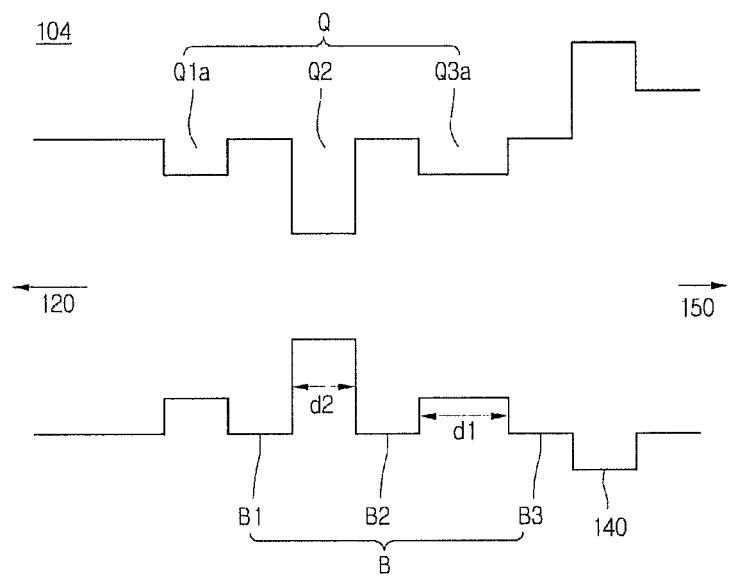
FIG. 12 is a graph showing an energy band diagram of a light emitting device according to a fourth embodiment.

FIG. 12 is a view showing an energy bandgap diagram 104 of the light emitting device according to the fourth embodiment.

The fourth embodiment can employ the technical characteristics of the first to third embodiments.

For example, according to the fourth embodiment, the energy bandgap of the third well layer Q3a may be greater than the energy bandgap of the second well layer Q2. Therefore, as the energy bandgap of the third well layer Q3a adjacent to the second conductive semiconductor layer 150 supplying carriers, for example, holes to the active layer 130 is greater than the energy bandgaps of the first and second well layers Q1a and Q2, the mobility of the holes can be easily achieved.

Therefore, holes crossing over the second conductive semiconductor layer 150 or the intermediate layer 140 may be more easily injected into the third well layer Q3a. Accordingly, the injection efficiency of holes is more increased, and the injection efficiency of holes into the first and second well layers Q1a and Q2 can be increased.

In addition, according to the fourth embodiment, the thickness of the third well layer Q3a may be thicker than the thickness of the second well layer Q2. The thickness of the third well layer Q3a is thicker than the thickness of the second well layer Q2, so that the energy levels of the light emitted from the well layers Q1a, Q2, and Q3a are uniformly formed even if the energy bandgaps between the well layers Q are different from each other. Accordingly, the broadening of the light emission spectrum of the light emitting device 100 can be reduced, and the generation of the shoulder P of the photoluminescence spectrum can be reduced. Therefore, the well structure having superior quality is formed, the light emission efficiency of the light emitting device 100 is improved, and the shift to the short wavelength does not occur.

In addition, according to the fourth embodiment, the first energy bandgap of the first well layer Qa1 may be greater than the second energy bandgap of the second well layer Q2. Accordingly, according to the fourth embodiment, the energy bandgap of the first well layer Q1a closest to the first conductive semiconductor layer 120 is increased, so that electrons are more easily injected into the next well layer. Accordingly, the injection efficiency of the electron carriers can be increased.

In addition, according to the fourth embodiment, in the state that hole carrier density is increased as the energy bandgap of the third well layer Q3a is increased, the energy bandgap of the first well layer Q1a is increased, so that the density of electron carriers is increased. Accordingly, the improvement of the electron carrier injection more increases the improvement of the light emission characteristic.

(Fifth Embodiment)

Figure 13:
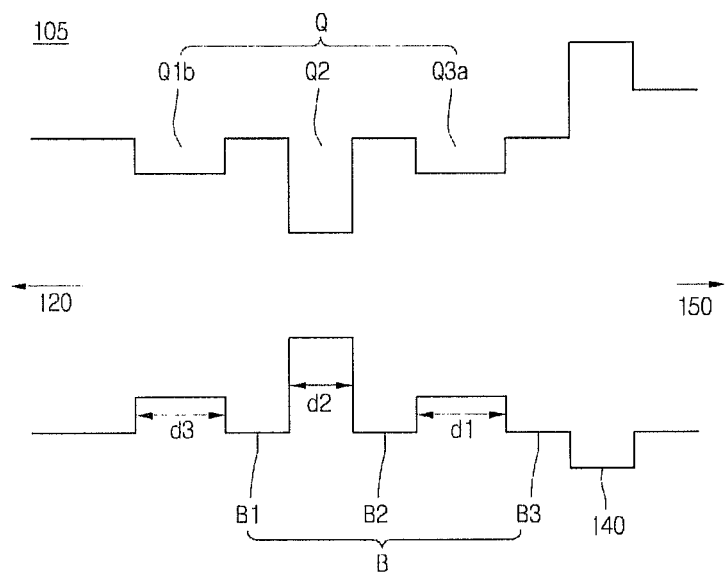
FIG. 13 is a graph showing an energy band diagram of a light emitting device according to a fifth embodiment.

FIG. 13 is a view showing an energy band diagram 105 of light emitting device according to a fifth embodiment.

The fifth embodiment can employ the technical characteristics of the first to fourth embodiments.

For example, according to the fifth embodiment, the energy bandgap of the third well layer Q3a may be greater than the energy bandgap of the second well layer Q2. In addition, according to the fifth embodiment, the thickness d1 of the third well layer Q3a may be thicker than the thickness d2 of the second well layer Q2.

In addition, according to the fifth embodiment, the first energy bandgap of the first well layer Q1b may be greater than the second energy bandgap of the second well layer Q2. In addition, according to the fifth embodiment, in the state that hole carrier density is increased as the energy bandgap of the third well layer Q3a is increased, the energy bandgap of the first well layer Q1b is increased, so that the electron carrier density is increased. Accordingly, the actual improvement of electron carrier injection more increases the improvement of the light emission characteristic.

According to the fifth embodiment, the thickness d3 of the first well layer Q1b may be thicker than the thickness d2 of the second well layer Q2. The thickness d3 of the first well layer Q1b is thicker than the thickness d2 of the second well layer Q2, so that the energy levels of lights generated from the well layers Q1b, Q2, and Q3a are uniform even if the well layers Q have different energy bandgaps. Therefore, the broadening of the light emission spectrum of the light emitting device 100 can be reduced, and the generation of the shoulder P of the photoluminescence spectrum can be reduced. Therefore, the well structure having a superior quality is formed, and the light emission efficiency of the light emitting device 100 is improved, so that the shift toward the short wavelength does not occur.

The embodiment can provide a light emitting device capable of improving luminous intensity by increasing the total amount of carriers injected into the active layer and a method for manufacturing the light emitting device.

In addition, the embodiment can provide a light emitting device capable of improving luminous intensity by increasing the distribution of carriers injected into the active layer, and a method for manufacturing the light emitting device.

In addition, the embodiment can provide a light emitting device capable of improving luminous intensity while minimizing the variation in the wavelength of the emitted light and a method for manufacturing the light emitting device.

In addition, the embodiment can provide a light emitting device capable of improving the recombination of carriers (holes and electrons) and improving a thin film characteristic by increasing the growth temperature of the well layer closest to a P-type semiconductor layer or an n-type semiconductor layer, and a method for manufacturing the light emitting device.

Figure 14:
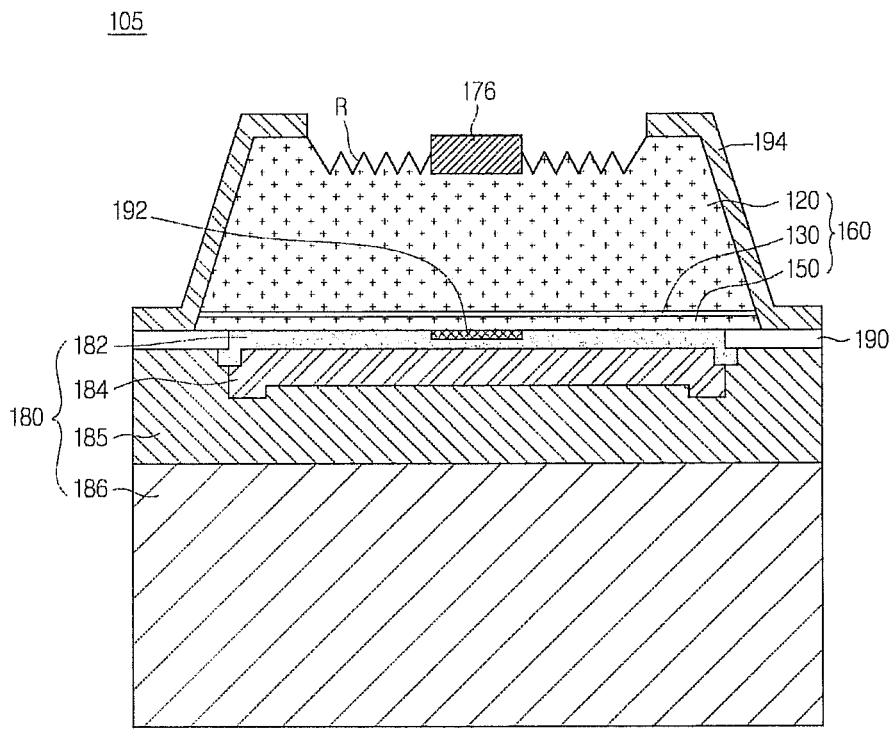
FIG. 14 is a sectional view showing a light emitting device according to another embodiment.

FIG. 14 is a sectional view showing a light emitting device 105 according to another embodiment.

Although FIG. 14 shows a vertical type light emitting device for the illustrative purpose, the embodiment is applicable to a horizontal type light emitting device, a flip chip-type light emitting device, or a hybrid type light emitting device including a via.

The light emitting device 105 according to another embodiment includes the light emitting structure 160, a passivation layer 194 formed on a portion of the top surface of the light emitting structure 160, and a first electrode 176 formed on the light emitting structure 160.

The light emitting structure 160 may include the first conductive semiconductor layer 120, the active layer 130, and the second conductive semiconductor layer 150. The light emitting structure 160 may employ the structure and the components described above with reference to FIG. 1.

A concavo-convex pattern R is formed on the top surface of the light emitting structure 160, so that the light extraction efficiency can be increased.

A second electrode layer 180 is formed under the light emitting structure 160, and the second electrode layer 180 may include an ohmic layer 182, a reflective layer 184, a bonding layer 185, and a support substrate 186.

For example, the ohmic layer 182 may includes a transmissive and conductive material. For example, the ohmic layer 182 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, and the embodiment is not limited thereto.

In addition, the reflective layer 184 may include a material representing a reflective property for light. For example, the reflective layer 184 may include a metal including at least one selected from the group consisting of Ag, Ni, Al, Rh, Pd, Ir, Ru, Mg, Zn, Pt, Au, and Hf, or the alloy thereof. In addition, the reflective layer 184 may be formed in a multiple layer structure by using a metal, the alloy thereof, or a transmissive and conductive material such as IZO, IZTO, IAZO, IGZO, IGTO, AZO, or ATO. For example, the reflective layer 184 may have a laminated structure such as IZO/Ni, AZO/Ag, IZO/Ag/Ni, or AZO/Ag/Ni.

In addition, the bonding layer 185 may include a material representing a superior bonding strength. For example, the bonding layer 185 may include at least one of Ti, Au, Sn, Ni, Cr, Ga, In, Bi, Cu, Ag and Ta.

In addition, the conductive support substrate 186 may include at least one of copper (Cu), Cu alloy, gold (Au), nickel (Ni), molybdenum (Mo), copper-tungsten (Cu—W), and carrier wafers (including Si, Ge, GaAs, GaN, ZnO, SiGe, and SiC)

A channel layer 190 may be formed at an outer portion of a bottom surface of the light emitting structure 160, and a current blocking layer (CBL) 192 may be formed between the light emitting structure 160 and the ohmic layer 182.

The channel layer 190 may be formed at an outer portion between the ohmic layer 182 and the second conductive semiconductor layer 150. A top surface of the channel layer 190 may make contact with the second conductive semiconductor layer 150 and the passivation layer 194, and the bottom surface and the lateral side of the channel layer 190 may surround the ohmic layer 182. In other words, the ohmic layer 182 may be surrounded by the channel layer 190.

Therefore, when an isolation etching is performed in order to separate the light emitting structure 160 according to unit chip regions, the channel layer 190 is not etched, so that cracking, which has been caused in the lateral side of the channel layer 190, can be effectively prevented.

The channel layer 190 may be formed by using a material having an electric insulation property, a material having electric conductivity lower than that of the reflective layer 184 or the bonding layer 185, or a material making schottky contact with the second conductive semiconductor layer 150. For example, the channel layer 190 may include at least one selected from the group consisting of ITO, IZO, IZTO, IAZO, IGZO, IGTO, AZO, ATO, ZnO, $SiO_2$, SiOx, SiOxNy, Si3N4, Al2O3, TiOx, TiO2, Ti, Al and Cr.

In addition, a portion of the channel layer 190 may be overlapped with the light emitting structure 160 in a vertical direction. The channel layer 190 increases the lateral-side distance between the ohmic layer 182 and the active layer 130, so that the probability for the electrical short between the ohmic layer 182 and the active layer 130 can be reduced. In addition, the channel layer 190 can prevent moisture from being permeated into the gap between the light emitting structure 160 and the support substrate 186.

The channel layer 190 can prevent electrical short in a chip separation process. In more detail, when the isolation etching process is performed in order to separate the light emitting structure 160 according to unit chip regions, fragments generated from the ohmic layer 182 are attached between the second conductive semiconductor layer 150 and the active layer 130, or between the active layer 130 and the first conductive semiconductor layer 120, so that electrical short occurs. The channel layer 190 prevents the electrical short.

The embodiment can provide a light emitting device capable of improving luminous intensity by increasing the total amount of carriers injected into the active layer and a method for manufacturing the light emitting device.

In addition, the embodiment can provide a light emitting device capable of improving luminous intensity by increasing the distribution of carriers injected into the active layer, and a method for manufacturing the light emitting device.

In addition, the embodiment can provide a light emitting device capable of improving luminous intensity while minimizing the variation in the wavelength of the emitted light and a method for manufacturing the light emitting device.

In addition, the embodiment can provide a light emitting device capable of improving the recombination of carriers (holes and electrons) and improving a thin film characteristic by increasing the growth temperature of the well layer closest to a P-type semiconductor layer or an n-type semiconductor layer, and a method for manufacturing the light emitting device.

Figure 15:
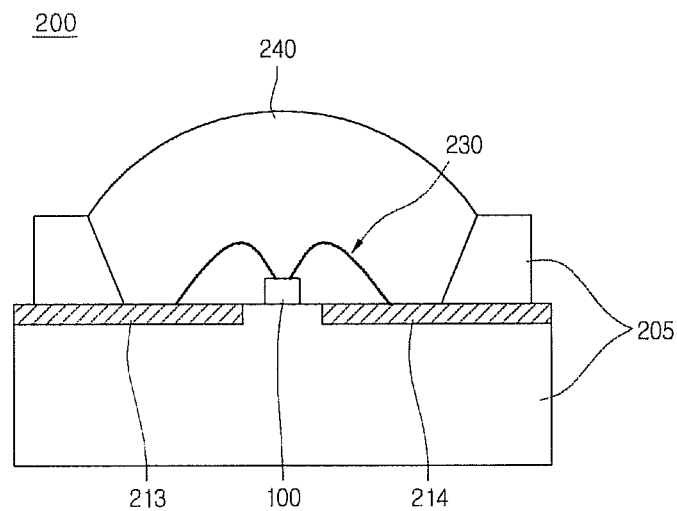
FIG. 15 is a sectional view showing a light emitting device package according to the embodiment.

FIG. 15 is a view showing a light emitting device package 200 in which a light emitting device according to the embodiments is installed.

The light emitting device package 200 according to the embodiment includes a package body 205, third and second lead electrodes 213 and 214 formed on the package body 205, the light emitting device 100 according to the embodiment, which is installed in the package body 205 and electrically connected to the third and second lead electrodes 213 and 214, and a molding member 240 surrounding the light emitting device 100.

The package body 205 may include silicon, synthetic resin, or metallic material. An inclined surface may be formed around the light emitting device 100.

The third and fourth lead electrodes 213 and 214 are electrically insulated from each other and supply power to the light emitting device 100. The third and second lead electrodes 213 and 214 may reflect light emitted from the light emitting device 100 to increase light efficiency, and may dissipate heat generated from the light emitting device 100 to the outside.

The light emitting device 100 may include a horizontal type light emitting device shown in FIG. 1, but the embodiment is not limited thereto. In addition, the light emitting device 100 may include a vertical type light emitting device shown in FIG. 14.

The light emitting device 100 may be mounted on the package body 205 or on the third lead electrode 213 or the fourth lead electrode 214.

The light emitting device 100 may be electrically connected with the third lead electrode 213 and/or the fourth lead electrode 214 through one of a wire scheme, a flip chip scheme and a die bonding scheme. Although FIG. 14 shows that the light emitting device 100 is electrically connected with the third lead electrode 213 and the fourth lead electrode 214 through a wire 230, the embodiment is not limited thereto.

The molding member 240 may protect the light emitting device 100 by surrounding the light emitting device 100. In addition, the molding member 240 may include phosphors (not shown) to change the wavelength of light emitted from the light emitting device 100.

A plurality of light emitting device packages according to the embodiment may be arrayed on the substrate. In addition, optical members, such as a light guide plate, a prism sheet, a diffusion sheet, and a fluorescence sheet may be installed on the path of light emitted from the light emitting device package. The light emitting device package, the substrate and the optical members may serve as a backlight unit or a lighting unit. For example, a lighting system may include a backlight unit, a lighting unit, an indicator, a lamp, or a street lamp.

Figure 16:
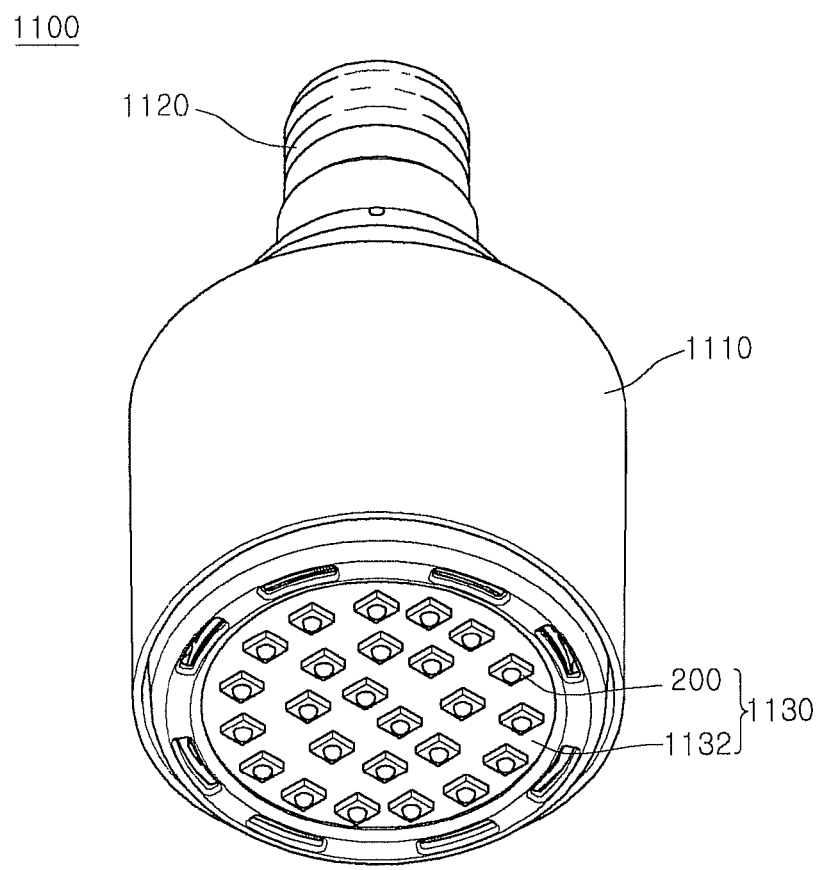
FIG. 16 is a perspective view showing a lighting unit according to the embodiment.

FIG. 16 is a perspective view showing a lighting unit 1100 according to the embodiment. The lighting unit 1100 of FIG. 16 is one example of a lighting system, but the embodiment is not limited thereto.

The lighting unit 1100 according to the embodiment may include a case body 1110, a light emitting module 1130 installed in the case body 1110, and a connector 1120 installed in the case 1110 to receive power from an external power source.

Preferably, the case body 1110 includes a material having a superior heat dissipation property. For example, the case body 1110 may include a metallic material or a resin material.

The light emitting module 1130 may include a substrate 1132 and at least one light emitting devices 200 installed on the substrate 1132.

The substrate 1132 may be formed by printing a circuit pattern on an insulator. For example, the substrate 1132 may include a PCB (Printed Circuit Board), a metal core PCB, a flexible PCB, or a ceramic PCB.

In addition, the substrate 1132 may include material that effectively reflects the light. A coating layer may be formed on the surface of the substrate 1132. At this time, the coating layer has a white color or a silver color to effectively reflect the light.

At least one light emitting device package 200 is installed on the substrate 1132. Each light emitting device package 200 may include at least one LED (light emitting diode) 100. The LED 100 may include an LED that emits the light of visible ray band having red, green, blue or white color and a UV (ultraviolet) LED that emits UV light.

The light emitting device package 200 of the light emitting module 1130 may be variously arranged to provide various colors and brightness. For instance, the combination of the white LED, the red LED and the green LED can be arranged to achieve the high color rendering index (CRI).

The connection terminal 1120 is electrically connected to the light emitting module 1130 to supply power to the light emitting module 1130. The connection terminal 1120 according to the embodiment has a shape of a socket screw-coupled with the external power source, but the embodiment is not limited thereto. For instance, the connection terminal 1120 can be prepared in the form of a pin inserted into the external power source or connected to the external power source through a wire.

Figure 17:
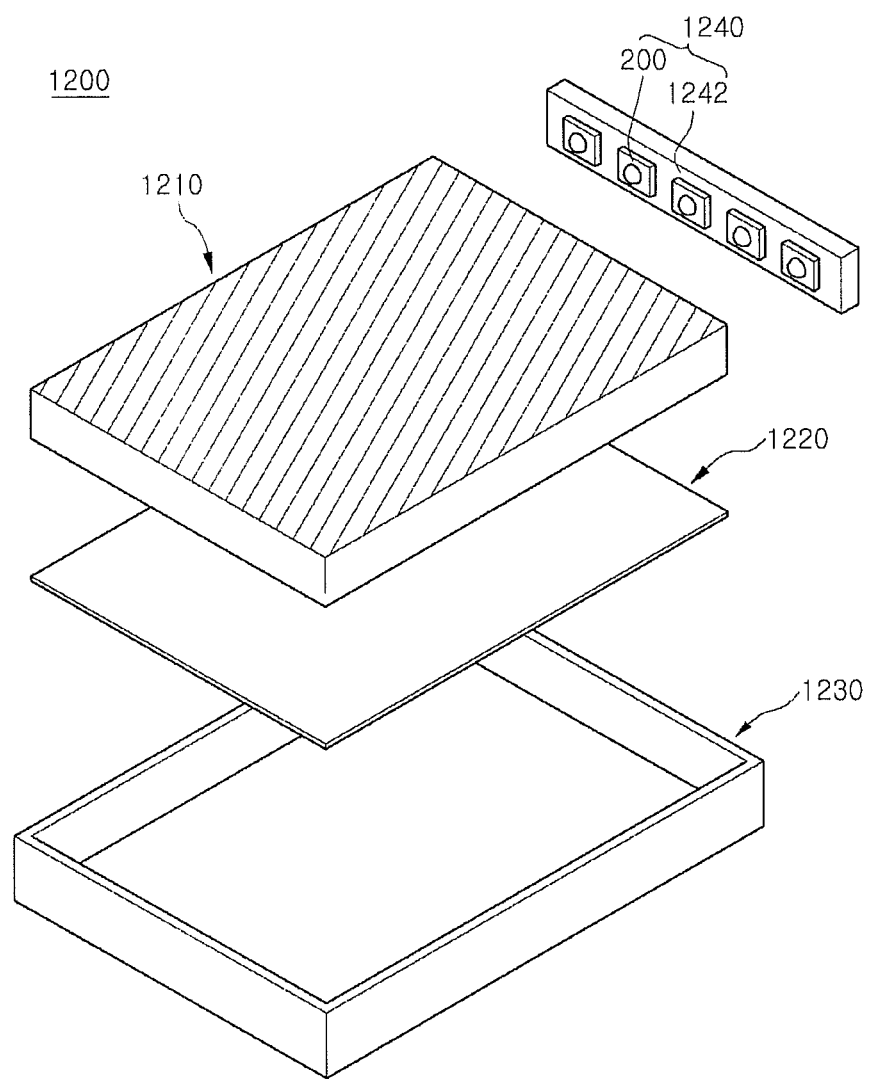
FIG. 17 is a perspective view showing a backlight unit according to the embodiment.

FIG. 17 is an exploded perspective view of a backlight unit 1200 according to the embodiment. The backlight unit 1200 of FIG. 17 is an example of a lighting system, but the embodiment is not limited thereto.

The backlight unit 1200 according to the embodiment includes a light guide plate 1210, a light emitting module part 1240 to supply light to the light guide plate 1210, a reflective member 1220 under the light guide plate 1210, and a bottom cover 1230 to receive the light guide plate 1210, the light emitting module part 1240, and the reflective member 1220, but the embodiment is not limited thereto.

The light guide plate 1210 diffuses the light to provide surface light. The light guide plate 1210 may include transparent material. For example, the light guide plate 1210 may include one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module part 1240 supplies the light to at least one side of the light guide plate 1210. The light emitting module part 1240 serves as the light source of the display device in which the backlight unit is installed.

The light emitting module part 1240 may make contact with the light guide plate 1210, but the embodiment is not limited thereto. In detail, the light emitting module part 1240 includes a substrate 1242 and a plurality of light emitting device packages 200 mounted on the substrate 1242. The substrate 1242 may make contact with the light guide plate 1210, but the embodiment is not limited thereto.

The substrate 1242 may be a printed circuit board (PCB) including a circuit pattern (not shown), but the embodiment is not limited thereto. In addition, the substrate 1242 may also include a metal core PCB (MCPCB) or a flexible PCB (FPCB) as well as the PCB, but the embodiment is not limited thereto.

In addition, the light emitting device packages 200 may be mounted on the substrate 1242 in such a manner that the light emission surface to emit light is spaced apart from the light guide plate 1210 at a predetermined distance.

The reflective member 1220 may be disposed below the light guide plate 1210. The reflective member 1220 reflects the light, which travels downward through the bottom surface of the light guide plate 1210, upward, thereby improving the brightness of the backlight unit. For example, the reflective member 1220 may include PET, PC or PVC resin, but the embodiment is not limited thereto.

The bottom cover 1230 may receive the light guide plate 1210, the light emitting module part 1240, and the reflective member 1220 therein. To this end, the bottom cover 1230 has a box shape with an opened top surface, but the embodiment is not limited thereto.

The bottom cover 1230 may be manufactured through a press process or an extrusion process by using metallic material or resin material.

The embodiment can provide a light emitting device capable of improving luminous intensity by increasing the total amount of carriers injected into the active layer, a method for manufacturing the light emitting device, a light emitting device package, and a lighting system.

In addition, the embodiment can provide a light emitting device capable of improving luminous intensity by increasing the distribution of carriers injected into the active layer, a method for manufacturing the light emitting device, a light emitting device package, and a lighting system.

In addition, the embodiment can provide a light emitting device capable of improving luminous intensity while minimizing the variation in the wavelength of the emitted light, a method for manufacturing the light emitting device, a light emitting device package, and a lighting system.

In addition, the embodiment can provide a light emitting device capable of improving the recombination of carriers (holes and electrons) and improving a thin film characteristic by increasing the growth temperature of the well layer closest to a P-type semiconductor layer or an n-type semiconductor layer, a method for manufacturing the light emitting device, a light emitting device package, and a lighting system.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive semiconductor layer;
an active layer comprising a well layer and a barrier layer on the first conductive semiconductor layer; and
a second conductive semiconductor layer on the active layer,
wherein the well layer comprises:
a first well layer adjacent to the first conductive semiconductor layer and having a first energy bandgap;
a third well layer adjacent to the second conductive semiconductor layer and having a third energy bandgap; and
a second well layer interposed between the first well layer and the third well layer and having a second energy bandgap,
wherein the first conductive semiconductor layer is an n-type semiconductor layer, and the second conductive semiconductor layer is a p-type semiconductor layer,
wherein the third well layer is disposed closest to the p-type semiconductor layer,
wherein the third energy bandgap of the third well layer is greater than the second energy bandgap of the second well layer and the first energy bandgap of the first well layer,
wherein a thickness of the third well layer is greater than both a thickness of the first well layer and a thickness of the second well layer, and
wherein the second energy bandgap of the second well layer is same with the first energy bandgap of the first well layer.

2. The light emitting device of claim 1, wherein the thickness of the second well layer is greater than a thickness of the first well layer.

3. The light emitting device of claim 1, wherein the thickness of the third well layer corresponds to 110% to 130% of a thickness of the first well layer or the thickness of the second well layer.

4. The light emitting device of claim 3, wherein the thickness of the third well layer is about 3.9 nm when the active layer emits blue light.

5. The light emitting device of claim 1, wherein the thickness of the second well layer is same with a thickness of the first well layer.

6. A light emitting device comprising:
a first conductive semiconductor layer;
an active layer including a well layer and a barrier layer on the first conductive semiconductor layer; and
a second conductive semiconductor layer on the active layer,
wherein the well layer comprises:
  a first well layer adjacent to the first conductive semiconductor layer and having a first energy bandgap;
  a third well layer adjacent to the second conductive semiconductor layer and having a third energy bandgap; and
  a second well layer interposed between the first well layer and the third well layer and having a second energy bandgap,
wherein the first conductive semiconductor layer is an n-type semiconductor layer, and the second conductive semiconductor layer is a p-type semiconductor layer,
wherein the third well layer is provided closest to the p-type semiconductor layer,
wherein the first well layer is provided closest to the n-type semiconductor layer,
wherein the third energy bandgap of the third well layer is greater than the second energy bandgap of the second well layer, and
wherein the third energy bandgap of the third well layer is greater than the first energy bandgap of the first well layer.

7. The light emitting device of claim 6, wherein a thickness of the third well layer is greater than a thickness of the second well layer.

8. The light emitting device of claim 6, wherein a thickness of the second well layer is same with a thickness of the first well layer.

9. The light emitting device of claim 6, wherein the second energy bandgap of the second well layer is same with the first energy bandgap of the first well layer.

10. The light emitting device of claim 1, wherein the second well layer and the first well layer have a same composition and
wherein a thickness of the second well layer is same as a thickness of the first well layer.

11. The light emitting device of claim 6, wherein the second well layer and the first well layer have a same composition and
wherein a thickness of the second well layer is same as a thickness of the first well layer.

* * * * *